(12) United States Patent
Seitz

(10) Patent No.: US 6,667,223 B2
(45) Date of Patent: Dec. 23, 2003

(54) HIGH ASPECT RATIO HIGH DENSITY PLASMA (HDP) OXIDE GAPFILL METHOD IN A LINES AND SPACE PATTERN

(75) Inventor: Mihel Seitz, Wappingers Falls, NY (US)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/905,357

(22) Filed: Jul. 13, 2001

(65) Prior Publication Data

US 2003/0013270 A1 Jan. 16, 2003

(51) Int. Cl.[7] .................................... H01L 21/76
(52) U.S. Cl. ........................... 438/427; 438/435
(58) Field of Search ............................ 438/424, 427, 438/435, 485, 778

(56) References Cited

U.S. PATENT DOCUMENTS

| | | | | |
|---|---|---|---|---|
| 5,480,763 A | * | 1/1996 | Kondo et al. ............. | 430/320 |
| 6,171,896 B1 | * | 1/2001 | Jang et al. ............... | 438/221 |
| 6,171,962 B1 | * | 1/2001 | Karlsson et al. .......... | 438/692 |
| 6,210,846 B1 | * | 4/2001 | Rangarajan et al. ...... | 430/30 |
| 6,251,783 B1 | * | 6/2001 | Yew et al. ................ | 438/692 |
| 6,265,302 B1 | * | 7/2001 | Lim et al. ................. | 438/622 |
| 2001/0049179 A1 | * | 12/2001 | Mori ........................ | 438/461 |

OTHER PUBLICATIONS

U. Gruening, et al., A Novel Trench DRAM Cell with VERtIcal Access Transistor and BuriEd Strap (VERI BEST) for 4Gb/16Gb.
C.J. Radens, et al., An orthogonal 6F$^2$ Trench–Sidewall Vertical Device Cell for 4Gb/16Gb DRAM; and.
A. Kersch, et al., Recent Advances in Feature Scale Simulation.

* cited by examiner

Primary Examiner—Michael Trinh
Assistant Examiner—Pamela Perkins
(74) Attorney, Agent, or Firm—Slater & Matsil, L.L.P.

(57) ABSTRACT

A method of providing isolation between active areas of memory cells in a memory device having a plurality of isolation trenches (115) separating the active areas, comprising depositing a first insulating material (116) and forming a resist (120) over the first insulating material (116) over at least the trenches (115), leaving a first top portion of the first insulating material (116) exposed. At least a second top portion of the first insulating material (116) is removed, the resist (120) is removed, and a second insulating material (216) is deposited over the wafer (100) to completely fill the isolation trenches (115).

31 Claims, 3 Drawing Sheets

HIGH ASPECT RATIO HIGH DENSITY PLASMA (HDP) OXIDE GAPFILL METHOD IN A LINES AND SPACE PATTERN

TECHNICAL FIELD

The present invention relates generally to the fabrication of integrated circuits (IC's), and more particularly to the fabrication of memory IC's.

BACKGROUND

Semiconductor devices are used in a variety of electronic applications, such as personal computers and cellular phones, for example. One such semiconductor product widely used in electronic systems for storing data is a semiconductor memory, and one common type of semiconductor is a dynamic random access memory (DRAM).

A DRAM typically includes a large number of individual DRAM cells arranged in an array, with each cell storing one bit of data. A DRAM memory cell typically includes an access field effect transistor (FET) and a storage capacitor. The access FET allows the transfer of data charges to and from the storage capacitor during reading and writing operations. In addition, the data charges on the storage capacitor are periodically refreshed during a refresh operation.

The semiconductor industry in general is being driven to decrease the size of semiconductor devices located on integrated circuits. Miniaturization is generally needed to accommodate the increasing density of circuits necessary for today's semiconductor products. As memory devices such as DRAMs are scaled down in size, various aspects of manufacturing DRAM IC's are becoming more challenging. For example, extreme aspect ratios (the ratio of the vertical depth of a trench to the horizontal width) in small-scale devices present insulating gapfill and subsequent planarization process limitations. Aggressive aspect ratios in DRAM devices are approaching 4:1 and greater, for example. The gap fill requirement is a function of ground rule layout and critical dimension (CD) tolerances, as examples FIG. 1 illustrates a cross-sectional view of a prior art DRAM 10 having closely nested features 2 and isolated features 4 having no minimum feature size and having no minimum distance apart. Often these two areas 2/4 are referred to as lines and spaces (L/S). The nested features 2 may comprise an array of densely-packed DRAM cells on minimum pitch, for example. Nested features 2 typically include lines and spaces that both comprise a minimum feature size, for example. Isolated features 4 also have the minimum pitch or feature size but are surrounded by a comparatively large space 6. Isolated features 4 are typically found in the peripheral circuitry of a DRAM layout, for example.

A substrate 12 is patterned with isolation trenches (IT's) 15. The depth requirement of the isolation trenches is a function of the individual circuitry and depends on the requirement of providing sufficient electrical insulation either between devices or n- or p-doped wells for improved latch-up immunity, for example. The electrical insulation provided by the isolation trenches is often referred to as shallow trench isolation (STI).

STI regions typically function to separate the element regions of the DRAM array and define the outline of the vertical array device with a bitline contact, for example. The element regions may include active areas, storage capacitors and other electronic devices such as transistors. Besides providing the definition of bitline contact landing area in the vertical DRAM cell, the isolation trenches 15 also prevent cross-talk between two neighboring DRAM cells connected via the same wordline, for example. Preventing cross-talk in this manner ensures that only one cell is modified when being written to by accessing one row and a corresponding column in the DRAM array, for example.

A typical prior art process flow for achieving a high aspect ratio gapfill will next be described. A pad nitride 14 is deposited over the substrate 12 prior to the isolation trench 15 formation. The trenches 15 are filled with an insulator 16, which insulator 16 may comprise high-density plasma (HDP) oxide deposited by chemical vapor deposition (CVD), which has become a common material and isolation technique used in semiconductor device manufacturing. HDP oxide 16 typically forms peaks 22 (also referred to as huts or miters) over features. The HDP oxide huts 22 may cause a void 18 to form between high-aspect ratio features. The HDP oxide huts 22 'pinch' off the flow of HDP oxide 16 into the trenches 15, thereby leading to incomplete gapfills. Incomplete gapfills become a problem in subsequent processing, for example, when a conductive layer is deposited on the wafer.

A problem in prior art isolation techniques is the formation of these voids 18 in high-aspect ratio trenches. As the minimum feature size is made smaller, the oxide gap fill of isolation trenches 15 becomes more challenging, especially in devices having vertical long channel transistors, for example. Leaving voids 18 in a finished semiconductor device results in device failures. Voids 18 may inadvertently be filled with conductive material in subsequent processing steps, for example.

Preventing the formation of voids 18 when an HDP oxide 16 insulator is used requires additional deposition steps: e.g., one or more additional HDP oxide deposition processes steps may be required in order to completely fill the trenches 15 to the top surface of the pad nitride 14. The HDP oxide 16 may be etched back to the top of the pad nitride 14, and at least one additional layer of HDP oxide (not shown) may be deposited and etched back until the trenches 15 are filled. Conductive material left in voids exposed after CMP processing steps may enter the trenches 15 and short elements in the substrate 12.

What is needed in the art is a method of filling isolation trenches 15 of a DRAM cell that minimizes the number of insulating layers 16 required to be deposited and prevents possible shorting of elements in the substrate 12.

SUMMARY OF THE INVENTION

The present invention provides a method of filling isolation trenches of a semiconductor device.

In accordance with a preferred embodiment, disclosed is a method of isolating active areas of a semiconductor memory device, the memory device including a plurality of trenches separating a plurality of element regions, the method comprising depositing a first insulating material over the trenches, the first insulating material comprising a first top portion and a second top portion. A resist is formed over the first insulating material over at least the trenches, leaving the first top portion of the first insulating material exposed. At least the second top portion of the first insulating material is removed.

In accordance with a preferred embodiment, also disclosed is a method of manufacturing a memory device, comprising providing a semiconductor wafer having a substrate, forming isolation trenches between substrate element regions, and depositing a first insulating material over the trenches, the first insulating material including a first top portion and a second top portion, the second top portion being larger than the first top portion. A resist is formed over portions of the trenches, leaving the first insulating material first top portion exposed, and at least the second top portion of the first insulating material is removed.

In accordance with a preferred embodiment, disclosed is a method of isolating element regions of a semiconductor wafer, comprising forming trenches between element regions, forming a first HDP oxide layer over the trenches, the first HDP oxide layer including huts, forming a resist over at least the trenches leaving a top portion of the first HDP oxide layer huts exposed, removing at least the first HDP oxide layer huts, and removing the resist.

Advantages of embodiments of the invention include providing a process flow in which the removal of insulating material within isolation trenches is self-aligned, and does not require an additional mask. The number of insulating material deposition steps is reduced in accordance with an embodiment of the present invention. A pad nitride layer and liner may serve as an etch stop during removal of the top portion of the first insulating material deposited, and an optional nitride liner provides increased processing parameters.

BRIEF DESCRIPTION OF THE DRAWINGS

The above features of embodiments of the present invention will be more clearly understood from consideration of the following descriptions in connection with accompanying drawings in which.

Corresponding numerals and symbols in the different figures refer to corresponding parts unless otherwise indicated. The figures are drawn to clearly illustrate the relevant aspects of the preferred embodiments and are not necessarily drawn to scale.

DETAILED DESCRIPTION OF PREFERRED EMBODIMENTS

Figure 1:
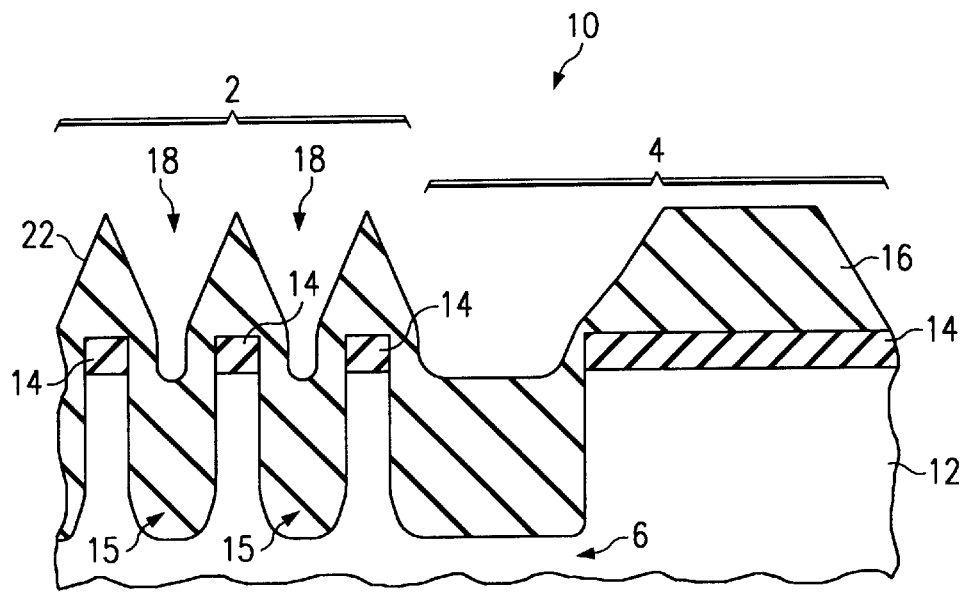
FIG. 1 illustrates a cross-sectional view of a prior art DRAM device.
Figure 2:
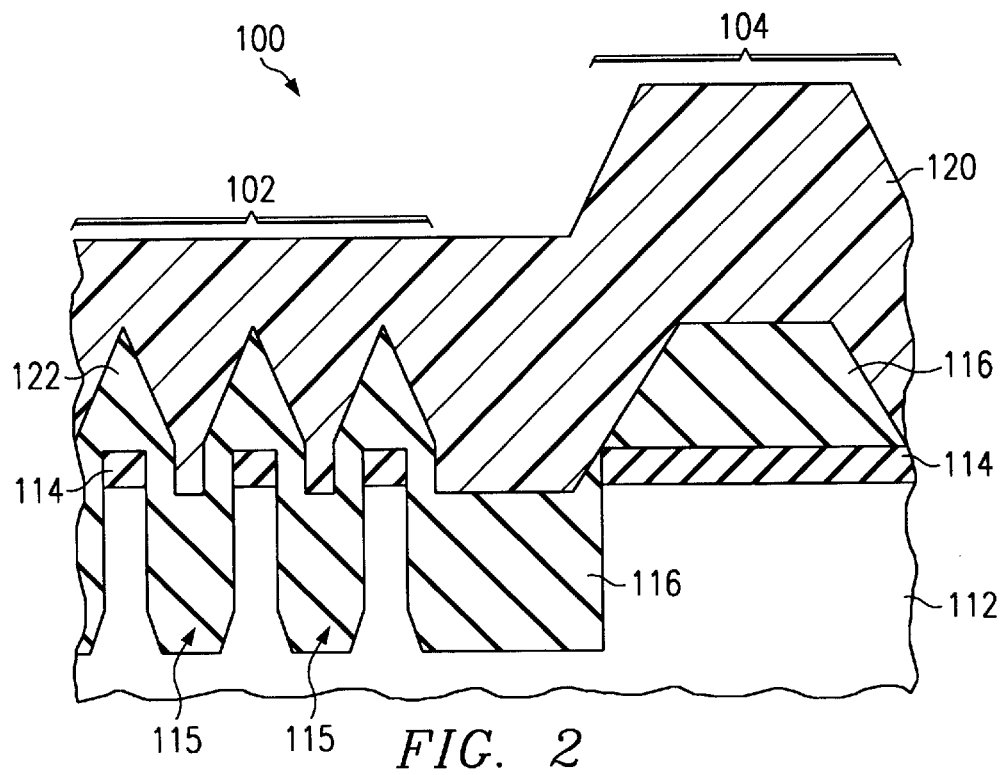
FIGS. 2 through 6 show cross-sectional views of an embodiment of the present invention in various stages of manufacturing.

A description of preferred embodiments of the present invention will be discussed, followed by a discussion of some advantages of preferred embodiments of the invention. Three active areas are shown in each figure, although many other active areas other components of a memory cell may be included in the semiconductor devices shown.

FIGS. 2 through 6 show cross-sectional views of a DRAM device in accordance with a preferred embodiment of the present invention at various stages of manufacturing. A wafer 100 having a substrate 112 is provided. The substrate typically comprises single-crystal silicon, although alternatively, compound semiconductors such as GaAs, InP, Si/Ge, and SiC may be used in place of silicon as a substrate material, as examples. The substrate 112 may include oxide layers, conductive layers or other semiconductor elements, e.g., transistors or diodes, for example.

A pad nitride 114 is deposited over the substrate 112. Pad nitride 114 preferably comprises SiN, as an example. The pad nitride 114 layer is preferably between around 100 to 200 nm, for example. Trenches 115 are formed within pad nitride 114 and substrate 112. Trenches 115 provide isolation between element regions, which may include active areas and storage capacitors within the substrate 112, as examples. The wafer 100 may comprise nested features 102 and isolated features 104. The nested features 102 may include a DRAM array, for example. Each memory cell within the DRAM array 102 must be isolated from adjacent memory cells, which isolation is provided by the trenches 115 formed.

An insulating material 116 is deposited within the trenches 115 and over the pad nitride 114, as shown. Insulating material 116 preferably has anisotropic fill characteristics, and preferably comprises silicon oxide deposited by HDP-CVD, as an example. Insulating material 116 is also referred to herein as HDP oxide. HDP oxide is preferably used for insulating material 116 because HDP oxide is typically more effective in filling the high-aspect ratio trenches 115 between active areas than other insulating material depositions, particularly in applications where high thermal budgets are applied in subsequent processing.

Depositing HDP oxide 116 over the wafer 100 results in the phenomenon of huts 122 that are formed over features such as the memory cells being isolated. The huts 122 appear as peaks or oxide that forms points over underlying features, as shown. The huts 122 may also be described as Bishop's miters (referring to the shape of a Bishop's hat).

Preferably, an amount of HDP oxide 116 is selected so that the HDP huts 122 have a spacing between one another of 20–30 nm. Such a spacing preferably results in ½ to ¾ of the trench 115 depth being filled, with the depth being the total depth of the trench 115 within the substrate 112. For example, the HDP oxide 116 is preferably between around 200 to 500 nm thick.

Next, in accordance with an embodiment of the present invention, a resist 120 is deposited over the HDP oxide 116. The resist 120 may comprise a commercial mid-ultraviolate (MUV) positive contrast, e.g., TOK 3250, and may alternatively comprise other photoresists, as examples. Preferably, the resist 120 is between around 300–600 nm thick, for example.

Figure 3:
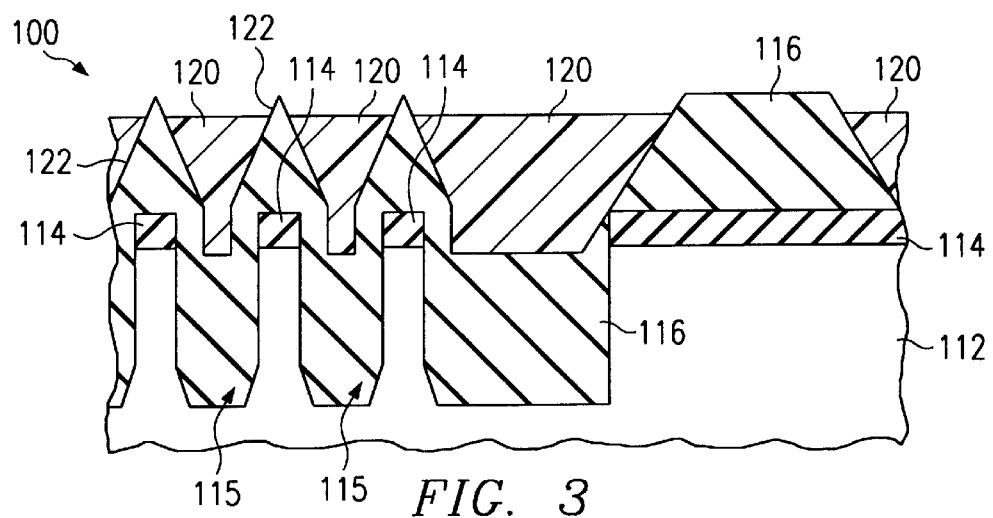

A top portion of the resist 120 is removed to expose a top portion of insulating layer 116, as shown in FIG. 3. Because of the phenomena of hut 122 formation found with HDP oxide, the tip of the huts 122 are now exposed through the resist 120, as shown. Preferably, the resist 120 portions are removed by exposure to MUV light, for example, for a predetermined period of time, e.g., between 5–30 seconds. Preferably, when a top portion of the resist 120 is removed, the resist 120 remains only between the features, e.g., over trenches 115, as shown in FIG. 3. The resist 120 is preferably removed elsewhere over the wafer, in order to obtain the most efficient gapfill process.

A resist 120 pattern residing only over trenches 115 is achieved in a preferred embodiment of the present invention by taking advantage of the topography of the wafer surface and the small dimensions of the technology. An appropriate resist 120 may be selected that has a shallow light absorption coefficient, leading to an incomplete resist development, leaving resist in the troughs over trenches 115 behind.

In another preferred embodiment of the present invention, a resist 120 pattern residing only over trenches 115 as shown in FIG. 3 is achieved using a flood exposure e.g., using no mask, of a wafer coated with resist. Due to the small spacing between the lines (e.g. trench 115 width), the pad nitride 114 material, which comprises an optically dense medium in a preferred embodiment, and a comparatively large wavelength selected and used for the flood exposure, the resist 120 between the lines over trenches 115 cannot be exposed and therefore remains during the developing process between the lines e.g., over trenches 115.

Preferably a top portion of the resist 120 is removed by exposure of the entire wafer 100 to light, for example, with a much longer optical wavelength than the spacing between the wafer features, for example, the distance between the trenches 115. The resist 120 between the huts 122 is not developed because of resolution. The lines and spaces function as a grid for the light if the distance within the grid is much smaller than the used wavelength. Preferably the resist 120 is partially exposed, which may be achieved by determining an optimized absorption constant of the photoresist 120.

Figure 4:
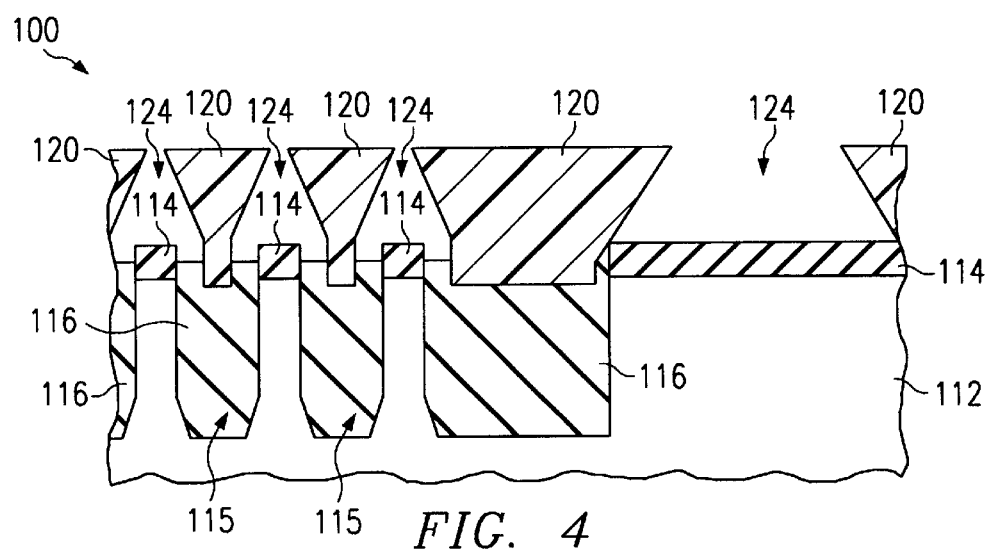

Because the resist 120 pattern resides only over trenches 115, consequently, the tops 122 of the miter-shaped HDP oxide 116 remain exposed. The miter tips 122 of the HDP oxide 116 may be removed in a subsequent etch step with the resist 120 in place, in accordance with an embodiment of the present invention, as shown in FIG. 4. Using the resist 120 as a mask, a top portion of the HDP oxide 116 is preferably selectively removed from the wafer surface. The pad nitride 114 may be used as a stopping layer during the removal of the HDP oxide 116 top portion, for example. When used as an etch stop, the pad nitride 114 provides some process margin for the selective HDP oxide 116 etch. The pad nitride 114 thickness determines how much process control is needed for the insulating material 116 etch, for example.

Alternatively, the wafer 100 may be exposed to a timed etch process to remove a top portion of the insulating material 116 from beneath the resist 120. The insulating material 116 timed etch is preferably isotropic. The insulating material 116 etch may comprise, as an example, a hydrofluoric (HF) acid-based wet etch, or alternatively, the insulating material 116 may be removed by reactive ion etching (RIE) or other dry etch.

Preferably, the insulating material 116 etch stops before reaching the silicon sidewalls 112, and more preferably, the insulating material 116 etch stops before any insulating material 116 is removed from within the trenches 115. Also, the insulating material 116 etchant must not come in contact with a gate oxide of elements within active regions of the substrate 112.

The resist 120 is then removed. The resist 120 may be removed by exposure to light, for example.

Figure 5:
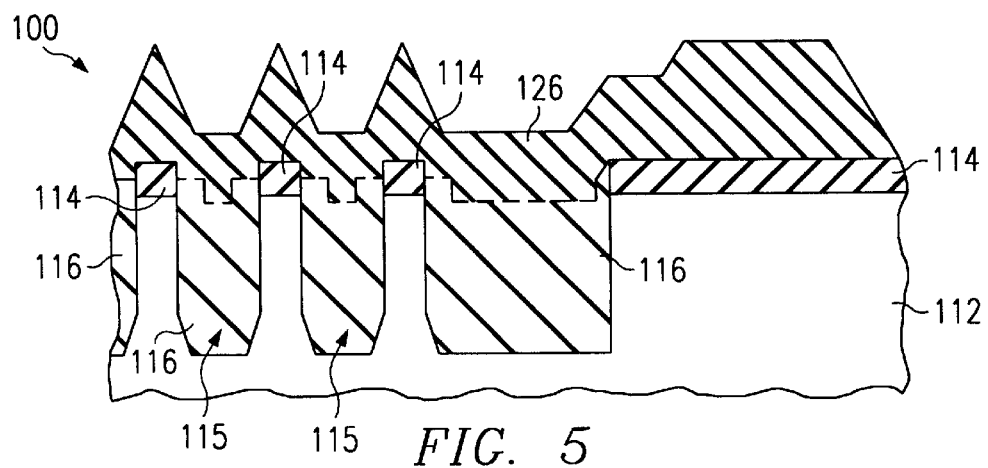

A second layer of insulating material 126 is deposited over the wafer after the resist removal to completely fill the trenches 115, illustrated in FIG. 5. Because the aspect ratio of the portion of the trench 115 that remains to be filled is lower than the original aspect ratio of the trench 115, the remainder of the isolation trenches 115 may be completely filled in the second insulating material deposition step, in accordance with an embodiment of the present invention.

Figure 6:
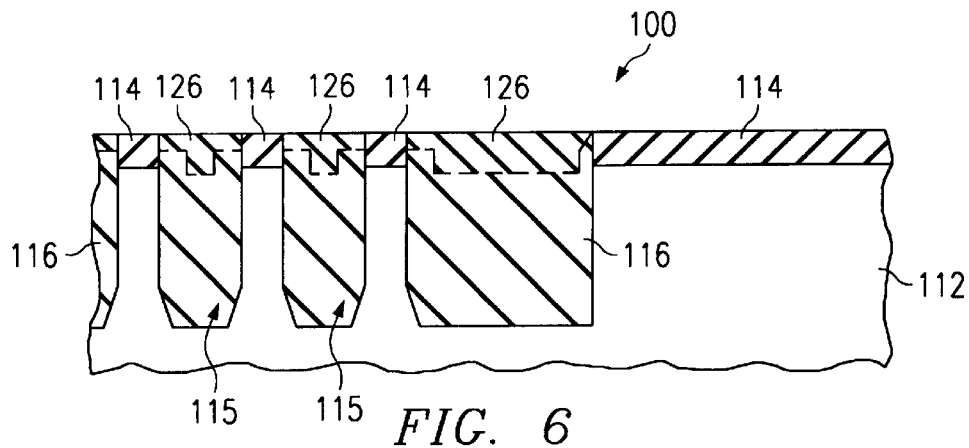

The wafer 100 may then be polished, e.g., by CMP, to remove the insulating material 126 from the top of the pad nitride 114, as shown in FIG. 6. Subsequent processing of the wafer 100 is then performed, such as removal of the pad nitride 114 and other processing steps.

Rather than removing a top portion of resist 120 and a top portion of insulating material 116 in two separate steps, alternatively, a single etch step may be used that is selective to nitride, that etches resist 120 and oxide 116 at the same etch rate. The etch may comprise a timed RIE etch, for example, comprising 20 sec.

Figure 7:
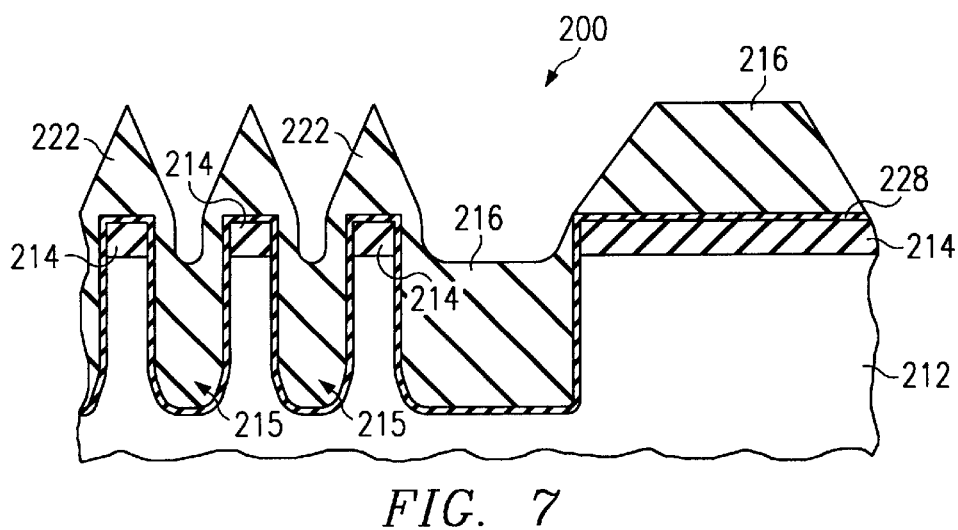
FIGS. 7 and 8 illustrate cross-sectional views of another embodiment of the present invention including a nitride liner.
Figure 8:
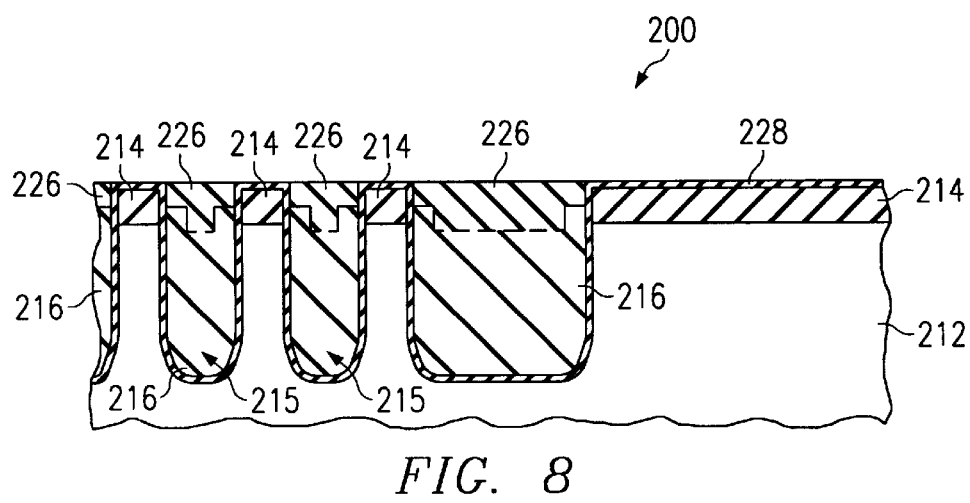

FIGS. 7 and 8 illustrate another preferred embodiment of the present invention. An optional nitride liner 228 is deposited over the pad nitride 214 and isolation trenches 215 prior to the deposition of the first insulating material 216, shown in FIG. 7. Preferably, nitride liner 228 comprises SiN, for example. Nitride liner 228 is preferably several nanometers thick, e.g., approximately 6 nanometers thick. A resist (not shown) is deposited preferably over only trenches 215, and a top portion of the first insulating material 216 is removed from beneath the resist 120, as previously described for FIGS. 2 through 6. A second insulating material 226 is deposited after the removal of the resist, and the wafer 200 is planarized, e.g., by CMP to remove portions of the second insulating material 226 from the top of the nitride liner 228, as shown in FIG. 8.

While embodiments of the present invention are described herein with reference to a DRAM, they also have useful application in ferroelectric random access memories (FRAM's) and other semiconductor devices. For example, embodiments of the present method may be used for isolating element regions of a semiconductor memory device or for p- and n-well separation in logic devices, as examples.

The present invention provides several advantages over prior art trench isolation methods for semiconductors. Advantages of the invention include providing a self-aligned process of filling isolation trenches that does not require the use of an additional mask. The process flow accomplishes filling isolation trenches 115/215 with insulating material 116/126/216/226 in only two deposition steps, optimizing the number of insulating layers required to be deposited is optimized. Non-uniformity in oxide 116/126/216/226 thickness is minimized, resulting in a robust subsequent CMP process.

Because a mask is not used, alignment problems are not introduced, in accordance with embodiments of the present invention. The number of insulating material deposition steps is reduced by use of embodiments of the present invention. An optional nitride liner 228 provides increased processing parameters. The pad nitride 114/214 and nitride liner 228 around trenches 115/215 may serve as an etch stop during removal of the top portion 122/222 of first insulating material 116/216 deposited.

While the invention has been described with reference to illustrative embodiments, this description is not intended to be construed in a limiting sense. Various modifications in combinations of the illustrative embodiments, as well as other embodiments of the invention, will be apparent to persons skilled in the art upon reference to the description. In addition, the order of process steps may be rearranged by one of ordinary skill in the art, yet still be within the scope of the present invention. It is therefore intended that the appended claims encompass any such modifications or embodiments. Moreover, the scope of embodiments of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A method of using high aspect trenches to provide STI (shallow trench isolation) of active areas of a semiconductor substrate, the method comprising the steps of:

providing a semiconductor substrate having a top surface covered by a pad nitride layer, said substrate defining a plurality of high aspect trenches, separated by element regions;

depositing a first insulating material over said high aspect trenches to partially fill said trenches to a level of between ½ to ¾ of the total depth of said trenches and thereby defining a void that extends below the top surface of said pad nitride layer of said substrate, the first insulating material further forming a hut disposed over each element region, each hut comprising a bottom portion adjacent the element region and a top portion disposed over the bottom portion;

forming a resist over the trenches, said resist filling said void between said element regions and leaving the hut top portion over each element region exposed;

removing the hut top portion and hut bottom of the first insulating material so as to expose each element region;

removing the resist, including resist that is filling said void; and depositing a second insulating material, said second insulating material to fill said void and cover said trenches and said element regions.

2. The method according to claim 1, wherein depositing a first insulating material comprises depositing high density plasma (HDP) oxide by chemical vapor deposition (CVD).

3. The method according to claim 1, wherein depositing a second insulating material comprises depositing HDP oxide.

4. The method according to claim 1, further comprising depositing a nitride liner over the trenches, before depositing the first insulating material.

5. The method according to claim 1, wherein forming a resist comprises:

depositing a resist over the first insulating material; and uniformly removing a portion of the resist to expose the hut top portions.

6. The method according to claim 5, wherein removing a portion of the resist comprises exposing the resist to an MUV light or flood exposure.

7. The method according to claim 5 wherein removing a portion of the resist comprises removing a portion of the first insulating material.

8. The method according to claim 1 wherein removing the hut bottom portion comprises a wet etch or RIE.

9. The method of claim 1, wherein the element regions each comprise a semiconductor region and a layer disposed over the semiconductor region.

10. The method of claim 9 wherein the element regions each comprise a silicon region and a nitride layer disposed over the silicon region.

11. The method according to claim 1 wherein said high aspect ratio trench has a ratio of at least 4:1.

12. A method of manufacturing a semiconductor device, the method comprising the steps of:

providing a semiconductor substrate having a top surface covered by a pad nitride layer, the substrate including a plurality of element regions;

forming high aspect trenches between the substrate element regions;

despositing a first insulating material over the trenches to partially fill said trenches to a level of between ½ and ¾ of the total depth of said trenches and thereby defining a void extending below said top surface of said pad nitride layer, the first insulating material including a first top portion and a second top portion, the first top portion overlying the second top portion, the second top portion being larger than the first top portion;

forming a resist over the first insulating material and the trenches, said resist filling said void extending below said top surface of said pad nitride layer;

uniformly removing a top portion of the resist to expose the first top portion of the first insulating material;

isotropically etching the first insulating material to remove at least the second top portion of the first insulating material;

removing the resist, including resist that is filling said void; and depositing a second insulating material to fill said void and cover said trenches.

13. The method according to claim 12, wherein depositing a first insulating material comprises depositing high density plasma (HDP) oxide.

14. The method according to claim 13, wherein depositing HDP oxide comprises forming huts over the substrate element regions.

15. The method according to claim 14 wherein the first insulating material first top portion comprises the HDP huts.

16. The method according to claim 12, wherein depositing a second insulating material comprises depositing HDP oxide.

17. The method according to claim 12, wherein removing a top portion of the resist comprises exposing the reisit to light.

18. The method according to claim 12 wherein removing a portion of the resist further comprises removing a portion of the first insulating material.

19. The method according to claim 12 wherein removing the first insulating material second top portion comprises removing the first insulating material from at least the top surface of the pad nitride.

20. The method according to claim 12, further comprising depositing a nitride liner over the high aspect trenches and pad nitride, before depositing the first insulating material.

21. The method according to claim 12 wherein removing the first insulating material second portion comprises removing the first insulating material second portion using a wet etch or reactive ion etch (RIE).

22. The method according to claim 12, wherein isotropically etching the first insulating material to remove at least the second top portion of the first insulating material further comprises removing a portion of the first insulating material in the trenches.

23. The method according to claim 12 wherein said high aspect ratio trench has a ratio of at least 4:1.

24. A method of isolating element regions of a semiconductor wafer, with high aspect trenches comprising the steps of:

forming high aspect trenches between element regions;

forming a first high density plasma (HDP) oxide layer over the trenches, to partially fill said trenches to a level between ½ and ¾ of the total depth of said trenches such that a void extending below said top surface of said substrate is defined therein , and the first HDP oxide layer including huts;

forming an unpatterned resist over at least the trenches, the unpatterned resist filling said void and leaving a top portion of the first HDP oxide layer huts exposed;

isotropically etching to remove at least the first HDP oxide layer huts;

removing the resist, including resist that is filling said void; and forming a second HDP oxide layer to fill said void and cover said first oxide layer.

25. The method according to claim 24 further comprising depositing a nitride liner over the trenches before forming a first HDP oxide layer.

26. The method according to claim 24 wherein said high aspect ratio trench has a ratio of at least 4:1.

27. A method of isolating element regions having a top surface and formed in a substrate of a semiconductor wafer with high aspect trenches, comprising the steps of:

forming high aspect trenches between element regions;

forming a first high density plasma (HDP) oxide layer over the trenches to partially fill the trenches to a level of between about ½ to ¾ of the total depth of said trenches so as to define a void extending below said top surface of said element regions, the first HDP oxide layer including huts;

forming a resist over the first HDP oxide layer, said resist filling said void;

uniformly removing a top portion of the resist to expose a top portion of the first HDP oxide layer huts;

removing at least the first HDP oxide layer huts;

removing the resist including resist that is filling said void; and forming a second HDP oxide layer to fill said void and cover the first HDP oxide layer.

28. The method according to claim 27, further comprising planarizing the second HDP oxide layer.

29. The method according to claim 27 further comprising depositing a nitride liner over the trenches before forming a first HDP oxide layer.

30. The method according to claim 1, wherein removing the hut top portion and the hut bottom portion from over each element region in the array portion comprises removing a portion of the first insulating material in the trenches.

31. The method according to claim 27 wherein said high aspect ratio trench has a ratio of at least 4:1.

* * * * *